United States Patent
Landru et al.

(10) Patent No.: US 10,510,565 B2
(45) Date of Patent: Dec. 17, 2019

(54) THERMAL TREATMENT SYSTEM WITH COLLECTOR DEVICE

(71) Applicant: Soitec, Bernin (FR)

(72) Inventors: Didier Landru, Le Champ près-Froges (FR); Oleg Kononchuk, Theys (FR); Sébastien Simon, Saint Martin D'Heeres (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 15/728,953

(22) Filed: Oct. 10, 2017

(65) Prior Publication Data
US 2018/0102264 A1    Apr. 12, 2018

(30) Foreign Application Priority Data
Oct. 11, 2016    (FR) ..................................... 16 59810

(51) Int. Cl.
*H01L 21/67*    (2006.01)
*F27D 5/00*    (2006.01)
(Continued)

(52) U.S. Cl.
CPC ...... *H01L 21/67109* (2013.01); *F27D 5/0037* (2013.01); *F27D 7/06* (2013.01);
(Continued)

(58) Field of Classification Search
CPC ... F27D 5/0037; F27D 7/06; H01L 21/67017; H01L 21/67109; H01L 21/67781; H01L 21/7624
(Continued)

(56) References Cited

U.S. PATENT DOCUMENTS 5,312,245 A     5/1994  Brannen et al.
5,322,567 A  *  6/1994  Deaton ................... C30B 25/14
                                                         118/715
(Continued)

FOREIGN PATENT DOCUMENTS

JP    2006228973 A  *  8/2006
JP    2008-053515 A     3/2008

OTHER PUBLICATIONS

Kononchuk et al., Novel Trends in SOI Technology for CMOS Applications, Solid State Phenomena, vols. 156-158 (Oct. 2009), 69-76.
(Continued)

*Primary Examiner* — Steven B McAllister
*Assistant Examiner* — Benjamin W Johnson
(74) *Attorney, Agent, or Firm* — TraskBritt (57) ABSTRACT

A thermal treatment system includes a chamber capable of receiving a plurality of substrates, a gas intake path in a distal portion of the chamber located opposite an area for entry of substrates into the chamber, and an outlet path for the gas and/or volatile species generated during the thermal treatment. The outlet path is located in a proximal portion of the chamber located near the area for entry of the substrates into the chamber. The system further includes a collector device in the proximal portion of the chamber. The collector device has a confinement opening oriented toward the distal portion of the chamber, and the collector device defines a compartment communicating with the outlet path, the compartment being configured so that the gas and the volatile species enter into the compartment via the confinement opening and pass through the compartment to reach the outlet path.

14 Claims, 5 Drawing Sheets

(51) Int. Cl.
*F27D 7/06* (2006.01)
*H01L 21/677* (2006.01)
*H01L 21/762* (2006.01)

(52) U.S. Cl.
CPC .. *H01L 21/67017* (2013.01); *H01L 21/67781* (2013.01); *H01L 21/7624* (2013.01)

(58) Field of Classification Search
USPC .......................................................... 432/200
See application file for complete search history.

(56) References Cited

U.S. PATENT DOCUMENTS 5,827,370 A * 10/1998 Gu ...................... C23C 16/4412
 118/715
6,814,813 B2 * 11/2004 Dando ................ C23C 16/4401
 118/719

OTHER PUBLICATIONS

French Preliminary Search Report for French Application No. FR1659810 dated Jun. 2, 2017, 2 pages.

* cited by examiner

THERMAL TREATMENT SYSTEM WITH COLLECTOR DEVICE

PRIORITY CLAIM

Pursuant to 35 U.S.C. § 119(a), this application claims the benefit of the filing date of French Patent Application Serial No. 1659810, filed Oct. 11, 2016, for "Thermal Treatment System With Collector Device."

TECHNICAL FIELD

The present invention relates to a thermal treatment system comprising a chamber capable of receiving a plurality of substrates. The system is provided with a collector device, in order to limit the deposits by condensation of a portion of the gases to be discharged, on the inner wall of the chamber and the specific contamination induced during the step of unloading the substrates.

BACKGROUND

Silicon or silicon-on-insulator (SOI) substrates are commonly used for the production of microelectronic devices. As is well known per se, such a substrate includes a useful layer of silicon and a buried oxide, arranged on a supporting substrate. In order to allow even greater integration of transistors on the substrates, the reduction of the lateral dimensions of the elementary components and the thinness of the etching require substrates with increasing quality, both in terms of crystalline quality and layer uniformity and in terms of specific contamination.

Figure 1A:
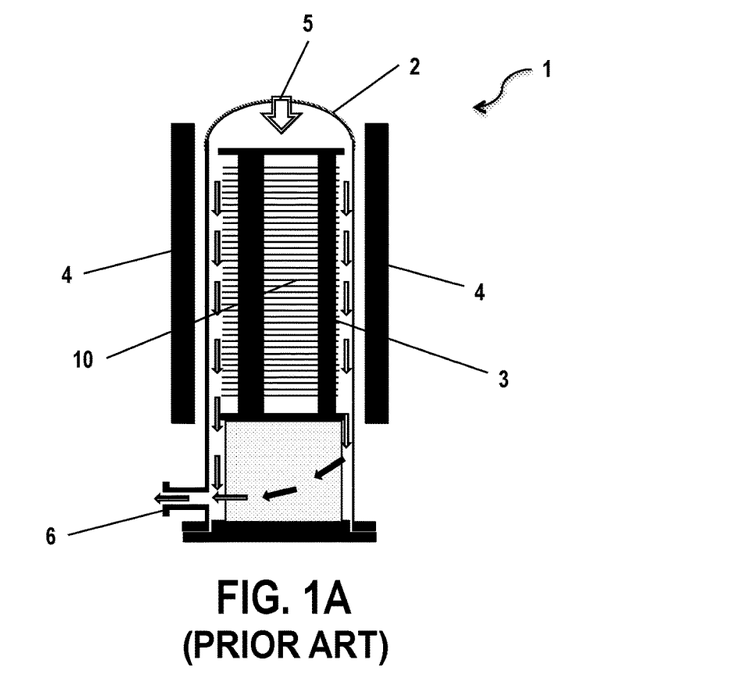
FIGS. 1A, 1B and 1C show a configuration of a vertical furnace of the prior art.

In order to produce an SOI substrate, high-temperature thermal treatments are applied, in particular during the steps of consolidating the bonding interface or the finish of the useful layers of silicon and buried oxide. Thermal treatment systems, in particular vertical furnaces, capable of treating a plurality of substrates simultaneously, are particularly suited to these types of treatments. As shown in FIG. 1A, a vertical furnace 1 is made up mainly of a chamber 2 (or tube) inside of which a loading column 3 supporting the plurality of substrates 10 can perform a vertical translation movement in order to load/unload the plurality of substrates 10 and to keep them in the chamber 2. Heating elements 4, arranged around the chamber 2, as well as at least one intake path 5 for new gas and an outlet path 6 for gas to be discharged, also make up this type of furnace.

As an example, SOI substrates may be subjected to a high-temperature thermal treatment (>1,100° C.) under an inert atmosphere in order to smooth the surface of the silicon and/or to dissolve all or part of the buried oxide (referred to as BOX). Under these treatment conditions, a reduction of the thickness of the BOX is observed due to a dissolution phenomenon. Gaseous silicon monoxide (SiO) is a product of the dissolution reaction. The silicon monoxide escapes from the surface of the SOI substrates in a quantity proportional to the dissolution speed, before being carried by the stream of heat-transfer gas circulating in the chamber 2 of the vertical furnace 1, towards the outlet path 6 of the furnace (also referred to as exhaust) located at the bottom of the chamber 2. The dissolution phenomenon is notably reported in the document "Novel trends in SOI Technology for CMOS applications" by O. Kononchuck et al., published in Solid State Phenomena, volume 156-158 (2010), pages 69 to 76.

Figure 1B:
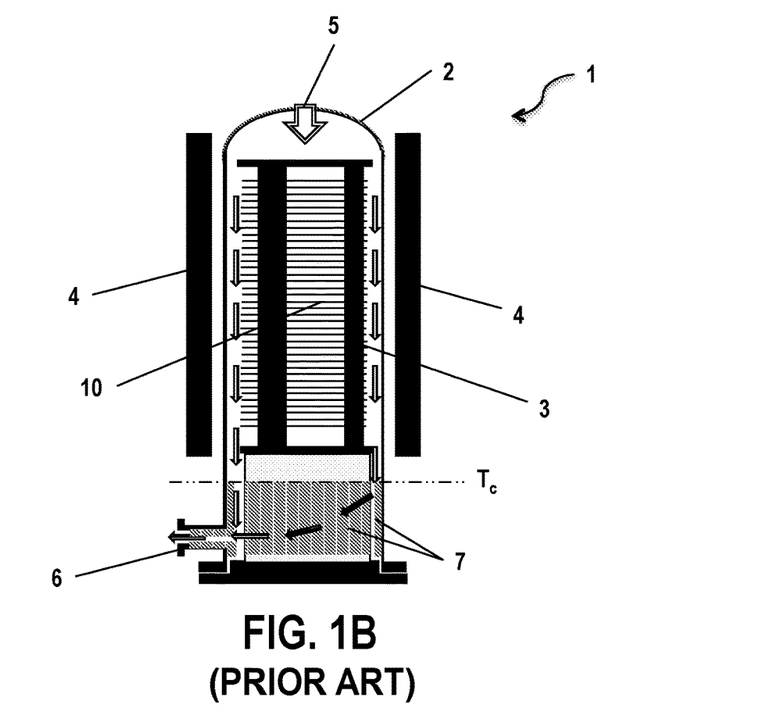
Figure 1C:
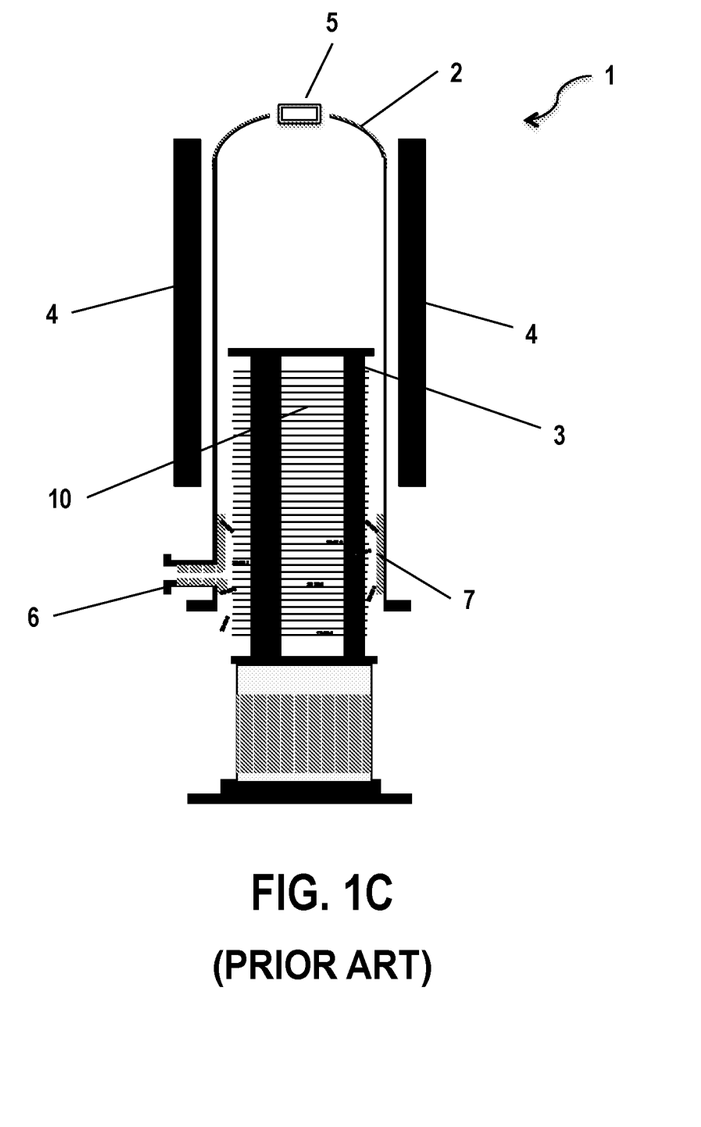

In the bottom of the chamber 2, the gas cools gradually when it leaves the area close to the heating elements 4 and circulates towards the exhaust 6. Since the SiO is not highly soluble in the heat-transfer gas, it condenses below a critical temperature on the solid portions of the bottom of the furnace 1: mainly, the inner walls of the chamber 2, the ducts of the outlet path 6 and the lower parts of the loading column 3 of the substrates 10 (FIG. 1B). SiO deposit 7 thickens throughout the treatment of the substrates 10 and can reach a thickness of several micrometers. Made up of a mixture of SiO, Si and $SiO_2$, it is under considerable stress and delaminates in the form of shavings when it becomes too thick. During the loading and unloading phases of the furnace 1, the loading column 3 enters and exits the chamber 2 and the substrates 10 then pass directly into the bottom of the chamber 2 where the SiO deposit 7 is present (FIG. 1C). The delamination of the latter induces specific contamination of the substrates 10, which is particularly detrimental to the final quality thereof.

Quartz protective screens can be placed against the bottom of the chamber 2, so as to collect most of the SiO deposit 7, thus ensuring the integrity of the chamber 2 of the furnace 1. These screens are sacrificial: they can be changed and make it possible to extend considerably the useful life of the chambers 2, which are extremely expensive parts of a thermal treatment system that take long to change.

Nevertheless, unless they are changed very regularly, which is not economically feasible, these protective screens are not a solution to the problem of specific contamination of the substrates 10 by the delamination of SiO deposits, since the loading column 3 of the substrates 10 continues to pass near contaminated screens during the loading and unloading steps.

BRIEF SUMMARY

The present invention aims to solve all or part of the aforementioned drawbacks. One subject of the invention is a thermal treatment system provided with a collector device which makes it possible to reduce or eliminate the presence of deposits in the chamber of the system, in substrate transit areas, in order to avoid specific contamination which is detrimental to the quality of the substrates.

The present invention relates to a thermal treatment system comprising a chamber capable of receiving a plurality of substrates, a gas intake path in a distal portion of the chamber located opposite an area where the substrates enter into the chamber, and an outlet path for the gas and/or volatile species generated during the thermal treatment, in a proximal portion of the chamber located near the area where the substrates enter into the chamber; the thermal treatment system is characterized in that it comprises, in the proximal portion of the chamber, a collector device:

having a confinement opening oriented towards the distal portion of the chamber, defining a compartment communicating with the outlet path, the compartment being configured so that the gas and the volatile species enter into the compartment via the confinement opening and pass through the compartment to reach the outlet path, in order to promote the deposit of the volatile species on inner surfaces of the collector device.

The gas and the volatile species circulating in the chamber are collected in the compartment of the collector device, in the proximal portion of the chamber where the volatile species are likely to condense and to form a deposit. The deposit, if any must form, occurs at least partially on the inner surfaces of the compartment of the collector device. If delamination occurs, the particles are essentially generated in the compartment of the collector device and not in the chamber: this considerably limits the risks of specific contamination during the transit of the substrates arranged in the loading column, for loading and/or unloading the system.

According to advantageous characteristics of the invention, taken either separately or in combination:
- the collector device has the general shape of a hollow cylinder with annular section, the annular section forming a section of the compartment;
- the collector device has the general shape of a hollow cylinder with annular section, the annular section forming a section of the compartment;
- the section of the compartment has a width of 1 to 10 mm, preferably 5 mm;
- the confinement opening is located in a position in the chamber where the temperature is higher than the critical condensation temperature of the volatile species;
- the compartment comprises a first cylindrical wall, arranged against an inner wall of the chamber, and a second cylindrical wall, the second cylindrical wall having at least one purge hole;
- the collector device comprises a tip capable of being inserted into the outlet path, one end of the tip being in communication with the compartment;
- the collector device is removable;
- the collector device is formed from a material selected among quartz, silicon carbide, silicon, aluminum nitride and alumina.

BRIEF DESCRIPTION OF THE DRAWINGS

Further characteristics and advantages of the present disclosure will be clear from the detailed description, made in reference to the appended figures, among which.

DETAILED DESCRIPTION

The figures are diagrammatic representations which should not be interpreted as having a limiting effect. The same references in the figures may be used for similar elements.

Figure 2A:
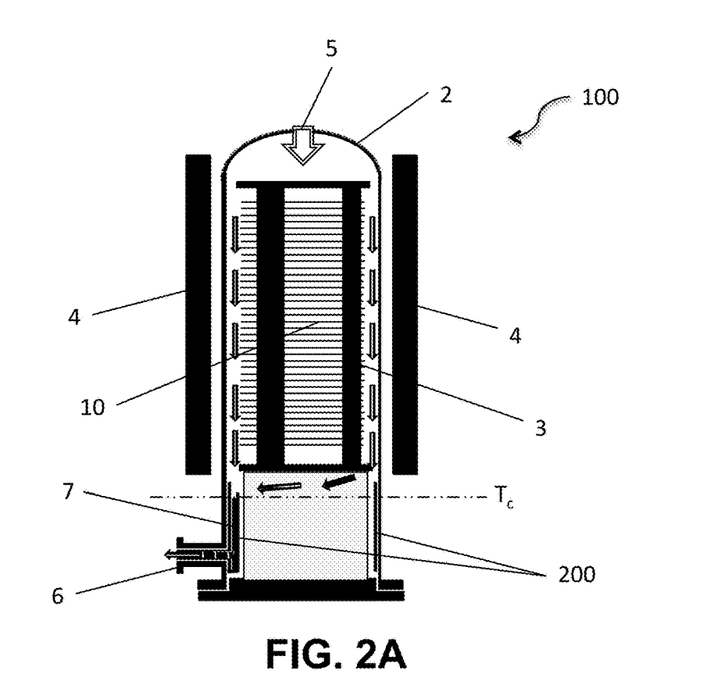
FIGS. 2A and 2B show a thermal treatment system provided with a collector device according to the invention.
Figure 2B:
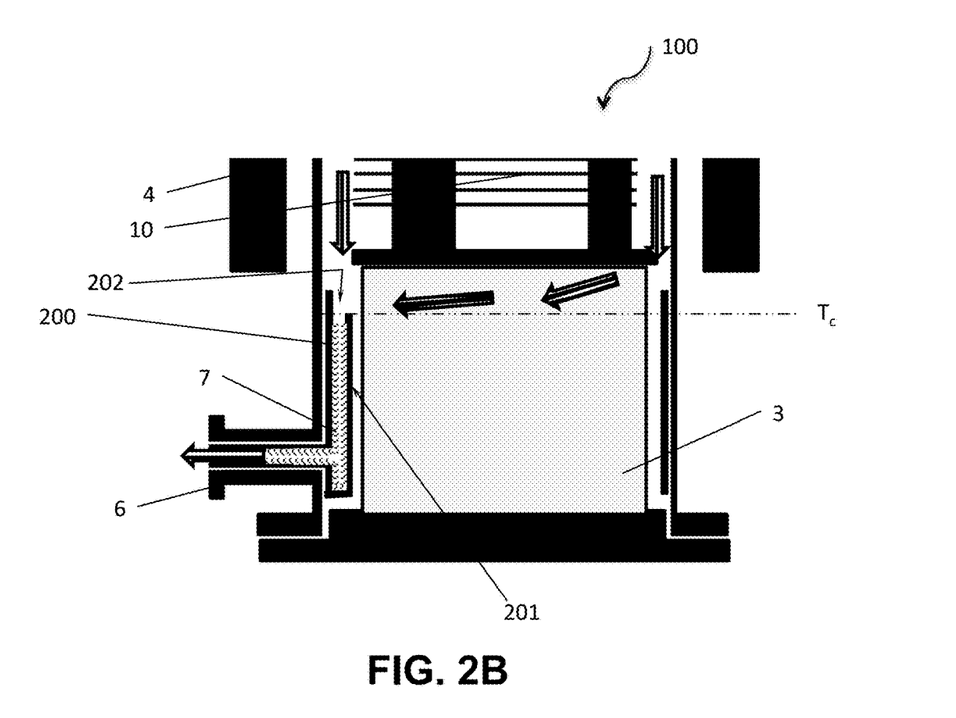

The invention relates to a thermal treatment system 100 capable of treating a plurality of substrates 10. As shown in FIGS. 2A and 2B, the system 100 comprises a chamber 2 capable of receiving a plurality of substrates 10, supported by a loading column 3. It likewise comprises an intake path 5 for a gas or a gas mixture, in a first portion, referred to as distal portion, of the chamber 2. Distal portion is understood to refer to the end of the chamber 2 located opposite the area where the substrates 10 enter into the chamber 2. It is common in thermal treatment systems in which the chamber is either horizontal or vertical for the gases to be injected into the distal portion of the chamber 2. The system 100 likewise comprises an outlet path 6 for the gas and/or volatile species potentially generated during the thermal treatment. Outlet path 6 is located in a second portion, referred to as proximal portion, of the chamber 2; the proximal portion is the portion of the chamber 2 located near the area where the substrates 10 enter into the chamber 2.

As an example, and as mentioned in the introduction, during a thermal treatment for smoothing SOI substrates, the gas injected by the intake path 5 is an inert gas such as argon; at temperatures around 1,100° C., a phenomenon of dissolution of the buried oxide appears, which produces a volatile compound: gaseous silicon monoxide (SiO). The SiO volatile species are then carried by the stream of argon towards the outlet path 6.

The thermal treatment system 100 also comprises a collector device 200, in the proximal portion of the chamber 2. The collector device 200 defines a compartment 201 in communication with the outlet path 6, wherein the gas and the volatile species are intended to circulate in order to be discharged. The collector device 200 is located in the proximal portion of the chamber 2 wherein the temperature falls due to the distance from the heating elements 4 of the system 100. In this portion, the gas and the volatile species will cool: all or part of the gas and/or the volatile species will thus be likely to condense on the walls of the elements with which they will have contact, forming a deposit 7, referred to as contaminating deposit in the rest of this description. The imposed circulation of the gas and the volatile species inside the compartment 201 promotes the formation of the contaminating deposit on the inner surfaces of the compartment 201 of the collector device 200. It is thus possible to limit the formation of the contaminating deposit 7 on the inner walls of the chamber 2 and/or on the outer surfaces of the collector device 200 as well as on the lower portions (i.e., those located in the proximal portion of the chamber 2) of the loading column 3. If delamination occurs, the particles are essentially generated in the compartment 201 of the collector device 200 and not in the chamber 2: this considerably limits the risks of specific contamination during the transit of the substrates 10 supported by the loading column 3, when loading and unloading the system 100.

The compartment 201 of the collector device 200 has a confinement opening 202 oriented towards the distal portion of the chamber 2. The compartment 201 is in communication with the chamber by means of the confinement opening 202. The gas and the volatile species circulating in the chamber 2 from the intake path 5 towards the outlet path 6 will enter into the compartment 201 via the confinement opening 202, pass through the compartment 201 and then reach the outlet path 6, the latter being in communication with the compartment 201. In order to reach the outlet path 6, the gas and the volatile species are thus forced to circulate through the compartment 201 of the collector device 200.

The confinement opening 202 is located below the central area of the chamber 2 in which the substrates are kept in the loading column 3.

Advantageously, the confinement opening 202 is located in a position in the chamber 2 at which the temperature of the gas and volatile species is higher than the critical condensation temperature of all or part of the volatile species. In the case of condensation, the contaminating deposit will then be deposited on the inner walls of the compartment 201, after the gas has entered via the confinement opening 202, thus preventing the deposit from being made on walls likely to release particles onto the substrates during the loading or unloading thereof, or onto the bottom parts of the loading column 3, which are difficult and expensive to change or clean.

In the depicted case of a vertical thermal treatment system 100, the height at which the confinement opening 202 is located will define the temperature of the volatile species upon entering the compartment 201. The height typically corresponds to the distance between the intake of the substrates 10 (at the bottom for a vertical furnace) and the confinement opening 202. In order to avoid contaminating SiO deposits 7 on the inner walls of the chamber 2, the height of the collector device 200 is selected so that the temperature of the volatile species upon entering the compartment 201 is higher than the critical condensation temperature ($T_a$) thereof.

For example, for volatile species of SiO, the latter will be at a temperature of around 1,100° C. upon entering the confinement opening 202 of the compartment 201, the critical condensation temperature being of the order of 1,050° C. For example, in a vertical furnace 100 in which the chamber 2 has a length of 170 cm and a section with a diameter of 35 cm, the height of the confinement opening 202 is around 30 cm, the central area in which the substrates 10 are supported by the loading column 3 extending from a height of 45 cm to a height of 150 cm.

Depending on the methods implemented in the thermal treatment system 100, defined by a temperature profile, a type of gas and volatile species, the height of the confinement opening 202 of the collector device 200 inside the chamber 2 may be different, in order to adapt to the height at which the species will be at the critical condensation temperature thereof. Depending on the methods, there may therefore be different collector devices 200, having specific dimensions.

Evidently, the confinement opening 202 of the collector device 200 will advantageously be at a lower height than that of the substrate closest to the intake area of the chamber 2.

Likewise, for the same method, according to the type of thermal treatment system 100 (its dimensions, its temperature control, etc.), the height of the confinement opening 202 of the collector device 200 may also be adapted, since the thermal profile inside the chamber 2 may be different in different systems.

Figure 3A:
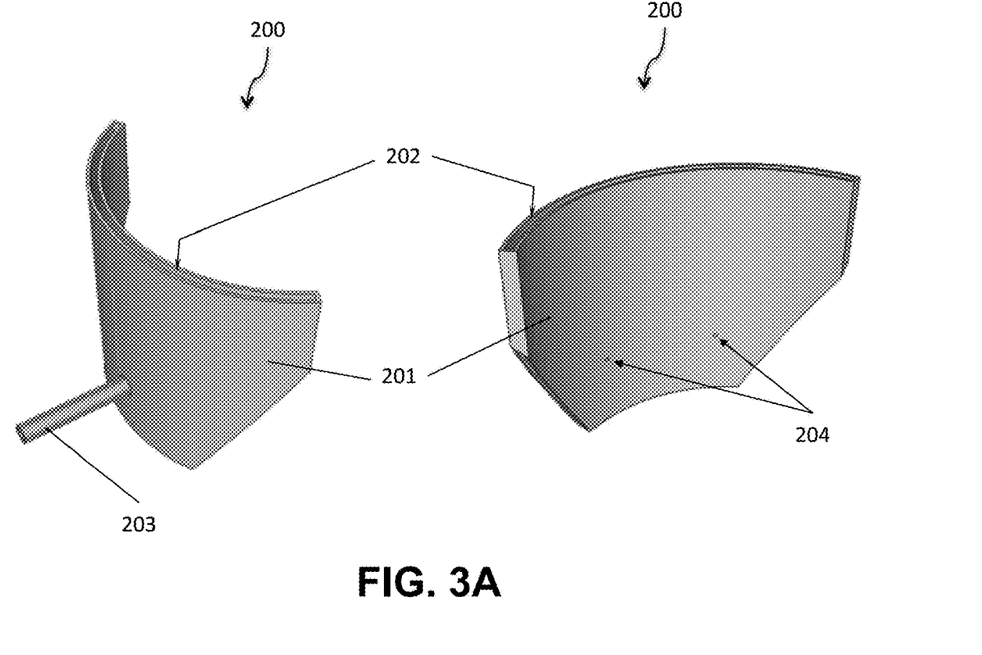
FIGS. 3A and 3B show an embodiment of a collector device according to the invention.
Figure 3B:
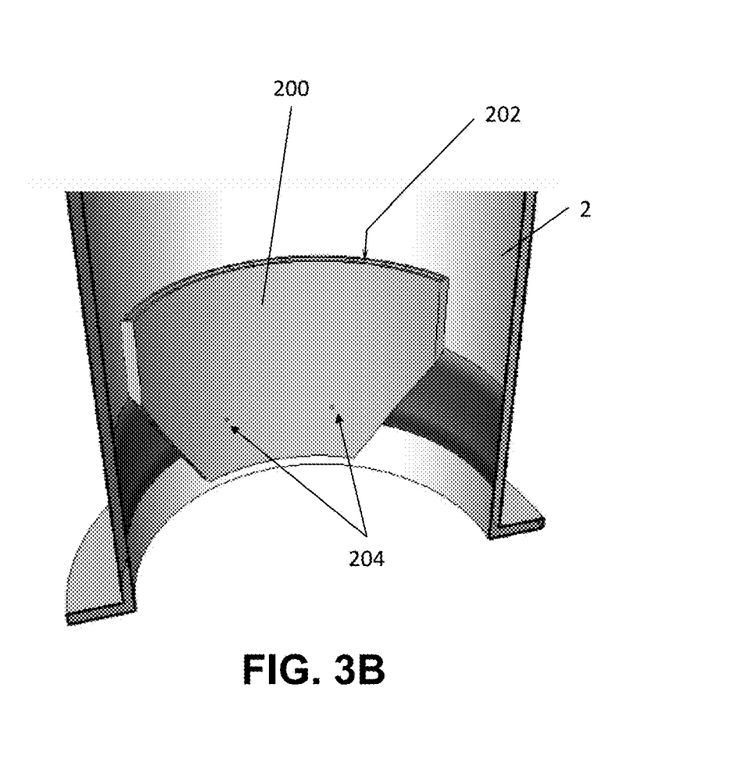

According to a first embodiment, the collector device 200 has the general shape of hollow cylinder portion with annular section (FIGS. 3A and 3B). The annular section forms a section of the compartment 201. The confinement opening 202 has the shape of a portion with an annular section. Advantageously, the collector device 200 comprises a tip 203 capable of being inserted into the outlet path 6, in order to protect, at least partially, the inner walls of the duct of the outlet path 6 from a contaminating SiO deposit 7. One end of the tip is in communication with the compartment 201.

FIG. 3B shows a partial view of the proximal portion of the chamber of a system 100 according to the first embodiment of the invention. A first cylindrical wall of the compartment 201 is arranged against the inner wall of the chamber 2; cylindrical wall is understood herein to refer to a wall forming a complete cylinder or forming a portion of a cylinder. A second cylindrical wall is opposite the first wall, towards the inside of the chamber 2, the second wall having a height substantially equivalent to that of the first wall. The tip 203 has been inserted into the outlet path 6.

According to one alternative, the first cylindrical wall, arranged against the inner wall of the chamber 2 may extend over the entire circumference of the inner wall and not only over a portion, while the second wall defines the compartment only on a cylinder portion.

Figure 4A:
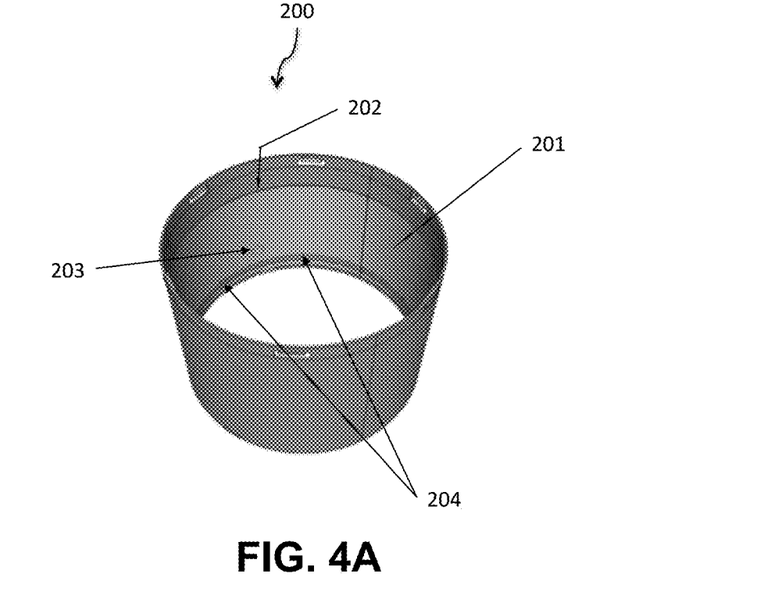
FIGS. 4A and 4B show another embodiment of a collector device according to the invention.
Figure 4B:
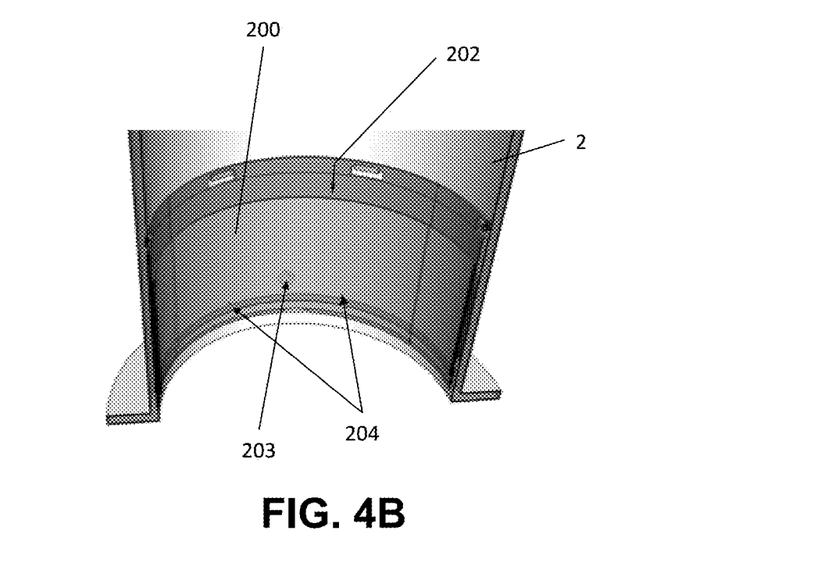

According to a second embodiment, shown in FIGS. 4A and 4B, the collector device 200 has the general shape of a hollow cylinder with annular section, the annular section forming a section of the compartment 201. The confinement opening 202 has the shape of an annular section. Advantageously, the collector device 200 comprises a tip 203 (not directly visible in the figures because it is in the background) capable of being inserted into the outlet path 6.

In either of the configurations described in the first and second embodiments, the stream of gas passes into the compartment 201. The volume of gas located in the proximal portion of the chamber 2 located between the confinement opening 202 and the intake of the chamber 2 thus is a dead volume in which no SiO deposit 7 occurs. However, for reasons of thermal protection of the door opening the system 100, it may be advantageous to maintain a small stream in the proximal portion. Thus, according to one alternative, the second cylindrical wall of the compartment 201 has at least one purge hole 204. This makes it possible to ensure a purge of the gas volume located between the confinement opening 202 of the compartment 201 and the intake of the chamber 2. It is, however, necessary to ensure that the total section of the purge holes 204 is negligible compared with the section of the confinement opening 202, in order to limit the formation of contaminating SiO deposits 7 inside the chamber 2 or on the outer surface of the second cylindrical wall of the compartment 201 (i.e., on the inside of the chamber 2) as much as possible.

Advantageously, the section of the compartment 201 and the confinement opening 202 have a width that can range from 1 to 10 mm, preferably 5 mm. This width, which defines the thickness of the collector device 200, is limited by the need for the loading column 3 to enter the chamber 2.

Advantageously, the collector device 200 is formed from a material selected among quartz, silicon carbide, silicon, aluminum nitride and alumina.

Advantageously, the collector device 200 is configured to be removable. The contaminating SiO deposit 7 can be removed by cleaning the collector device 200, after it has been removed from the system 100. It can then be reinstalled in the thermal treatment system 100 for a new use.

The invention is particularly useful during thermal treatment for smoothing SOI substrates leading to the dissolution of the BOX and generating SiO gaseous species to be discharged, which condense and form an SiO deposit 7 on the walls by cooling.

It can obviously be used for other types of thermal treatment for which a portion of the gaseous species provided in the chamber 2 is likely to condense below a certain temperature and to form an SiO deposit 7, the subsequent delamination of which is detrimental to the quality of the treated substrates.

The invention has been depicted in reference to a thermal treatment system with vertical structure (i.e., in which the main dimension of the chamber is positioned vertically) as an example. The invention can also form a thermal treatment system with horizontal structure.

Furthermore, the invention is not limited to the described embodiments and variant embodiments can be provided without going beyond the scope of the invention as defined by the claims.

What is claimed is:

1. A thermal treatment system, comprising: a chamber capable of receiving a plurality of substrates supported by a loading column, the chamber having:
   a proximal portion located near an area for entry of the plurality of substrates into the chamber, the proximal portion having an opening in a bottom portion thereof configured to receive the loading column with the substrates;

a distal portion corresponding to an end of the chamber, located opposite the area for entry of the plurality of substrates into the chamber;

a central area in which the plurality of substrates is kept on the loading column, the central area extending between the proximal portion and the distal portion;

a gas intake path in the distal portion of the chamber;

an outlet path for gas and/or volatile species generated during operation of the thermal treatment system, the outlet path located in the proximal portion of the chamber; and a collector device in the proximal portion of the chamber, wherein:

the collector device has a confinement opening oriented toward the distal portion of the chamber;

the collector device defines a compartment between first and second convex walls of the collector device that communicates with the outlet path;

the compartment is configured so that the gas and/or the volatile species enter into the compartment via the confinement opening in a vertical direction, and exit the compartment in a horizontal direction to reach the outlet path; and the collector device comprises a tip in communication with the compartment that is insertable into the outlet path.

2. The thermal treatment system of claim 1, wherein the collector device has the general shape of a hollow cylinder portion with an annular section, the annular section forming an annular section of the compartment.

3. The thermal treatment system of claim 1, wherein the collector device has the general shape of a hollow cylinder with an annular section, the annular section forming a section of the compartment.

4. The thermal treatment system of claim 3, wherein the annular section of the compartment has a width in a range extending from 1 mm to 10 mm.

5. The thermal treatment system of claim 2, wherein the annular section of the compartment has a width in a range extending from 1 mm to 10 mm.

6. The thermal treatment system of claim 5, wherein the confinement opening is located at a position in the chamber where the temperature is higher than a critical condensation temperature of volatile species during operation of the thermal treatment system.

7. The thermal treatment system of claim 6, wherein the collector device comprises:

a first cylindrical wall arranged adjacent an inner wall of the chamber; and a second cylindrical wall having at least one purge hole.

8. The thermal treatment system of claim 7, wherein the collector device is removable.

9. The thermal treatment system of claim 8, wherein the collector device is formed from a material selected from the group consisting of quartz, silicon carbide, silicon, aluminum nitride, and alumina.

10. The thermal treatment system of claim 1, wherein the confinement opening is located at a position in the chamber where the temperature is higher than a critical condensation temperature of volatile species during operation of the thermal treatment system.

11. The thermal treatment system of claim 1, wherein the chamber is a vertical chamber, and wherein the confinement opening is located at a height that is lower than a substrate closest to the area for entry of the plurality of substrates into the chamber during operation of the thermal treatment system.

12. The thermal treatment system of claim 1, wherein the collector device comprises:

a first cylindrical wall arranged adjacent an inner wall of the chamber; and a second cylindrical wall having at least one purge hole.

13. The thermal treatment system of claim 1, wherein the collector device is removable.

14. The thermal treatment system of claim 1, wherein the collector device is formed from a material selected from the group consisting of quartz, silicon carbide, silicon, aluminum nitride, and alumina.

* * * * *

UNITED STATES PATENT AND TRADEMARK OFFICE
CERTIFICATE OF CORRECTION

PATENT NO.       : 10,510,565 B2
APPLICATION NO.  : 15/728953
DATED            : December 17, 2019
INVENTOR(S)      : Didier Landru, Oleg Kononchuk and Sébastien Simon Page 1 of 1

It is certified that error appears in the above-identified patent and that said Letters Patent is hereby corrected as shown below:

In the Specification
        Column 5,    Line 8 & 9,    change "temperature ($T_a$) thereof" to
                                                           --temperature ($T_c$) thereof--

In the Claims
    Claim 3,    Column 7,    Line 33 & 34,    change "section forming a section" to
                                                           --section forming an annular section--

Signed and Sealed this
Fourth Day of February, 2020

Andrei Iancu
*Director of the United States Patent and Trademark Office*